(12) United States Patent
Schwartz et al.

(10) Patent No.: US 7,672,396 B2  
(45) Date of Patent: Mar. 2, 2010

(54) REDUCING IMAGE SPECTRAL LEAKAGE DUE TO I-Q IMBALANCE

(75) Inventors: Adam L. Schwartz, San Carlos, CA (US); Sujai Chari, San Franciso, CA (US)

(73) Assignee: NDSSI Holdings, LLC, San Jose, CA (US)

( * ) Notice: Subject to any disclaimer, the term of this patent is extended or adjusted under 35 U.S.C. 154(b) by 694 days.

(21) Appl. No.: 11/472,973

(22) Filed: Jun. 22, 2006

(65) Prior Publication Data

US 2007/0297532 A1 Dec. 27, 2007

(51) Int. Cl.  
*H04L 25/49* (2006.01)

(52) U.S. Cl. .............. 375/296; 375/260; 375/295; 375/297; 455/114.3; 455/63.1; 455/126

(58) Field of Classification Search .......... 375/295, 375/296, 297, 260  
See application file for complete search history.

(56) References Cited

U.S. PATENT DOCUMENTS

| | | | |
|---|---|---|---|
| 6,864,745 B2 | 3/2005 | Ode et al. | |
| 7,020,226 B1 * | 3/2006 | Kirkland | 375/355 |
| 7,274,750 B1 * | 9/2007 | Mueller | 375/297 |
| 2003/0035470 A1 | 2/2003 | Gu | |
| 2003/0098752 A1 | 5/2003 | Haghighat | |
| 2003/0223480 A1 | 12/2003 | Cafarella | |
| 2004/0203472 A1 | 10/2004 | Chien | |
| 2005/0041754 A1 | 2/2005 | Wu et al. | |
| 2005/0069055 A1 | 3/2005 | Song | |
| 2007/0263667 A1 * | 11/2007 | Dubuc et al. | 370/500 |

\* cited by examiner

*Primary Examiner*—Chieh M Fan  
*Assistant Examiner*—Siu M Lee  
(74) *Attorney, Agent, or Firm*—Brian R. Short

(57) ABSTRACT

Methods of reducing spectral leakage due to I-Q imbalance within a transmitter are disclosed. The method includes the transmitter receiving a data stream of coefficients of a multi-carrier modulation signal. The data stream is pre-processed by processing a set of the coefficients that correspond with selected notch frequencies to reduce the effects of I-Q imbalance of the transmitter, wherein at least a portion of the set of coefficients corresponds to non-symmetrical notch frequencies. The pre-processed data stream is multi-carrier modulated. The multi-carrier modulated pre-processed data stream is I-Q modulated before transmission.

17 Claims, 6 Drawing Sheets

```
┌─────────────────────────────────────────────────────────────┐
│ The transmitter receiving a data stream of coefficients of  │
│ a multi-carrier modulation signal                           │
│                                                             │
│                          410                                │
└─────────────────────────────────────────────────────────────┘
                              │
                              ▼
┌─────────────────────────────────────────────────────────────┐
│ Pre-processing the data stream by processing a set of the   │
│ coefficients that correspond with selected notch            │
│ frequencies to reduce the effects of I-Q imbalance of the   │
│ transmitter, wherein at least a portion of the set of       │
│ coefficients corresponds to non-symmetrical notch           │
│ frequencies                                                 │
│                          420                                │
└─────────────────────────────────────────────────────────────┘
                              │
                              ▼
┌─────────────────────────────────────────────────────────────┐
│ Multi-carrier modulating the pre-processed data stream      │
│                                                             │
│                          430                                │
└─────────────────────────────────────────────────────────────┘
                              │
                              ▼
┌─────────────────────────────────────────────────────────────┐
│ I-Q modulating the multi-carrier modulated pre-processed    │
│ data stream                                                 │
│                                                             │
│                          440                                │
└─────────────────────────────────────────────────────────────┘
```

FIGURE 4

REDUCING IMAGE SPECTRAL LEAKAGE DUE TO I-Q IMBALANCE

FIELD OF THE INVENTION

The invention relates generally to communication systems. More particularly, the invention relates to a method and apparatus for reducing image spectral leakage due to I-Q imbalance.

BACKGROUND OF THE INVENTION

Frequency spectrum available for wireless communications is limited and must be intelligently used. Intelligent frequency spectrum usage can include improving the efficiency of frequency spectrum utilization. By intelligently sharing frequency spectrum, wireless devices can co-exist with each other, and obtain higher overall utilization of the frequency spectrum than if the wireless devices were to co-exist by, for example, limiting the power levels of transmission signals to minimize interference of each wireless device with the other.

One example of intelligent frequency usage includes detect and avoid (DAA). DAA devices "listen" for other signals while transmitting in a given frequency spectrum at a predetermined emission level. If a DAA device senses another wireless device operating in the same frequency range, the device either lowers its output power, or switches to another frequency. By doing this, the device can avoid interfering with the other device, and at the same time, not have to satisfy burdensome transmission restrictions when the other device is not present.

FIG. 1 shows a typical communication link between a first transceiver 110 and a second transceiver 130. The transceivers 110, 130 can include transmission signals that interfere with a victim transceiver 140 of, for example, another network. As shown, the intended communication link of the victim transceiver 140 includes communication signals having a transmission frequency of $f_m$. A network (such as the transceivers 110, 130) employing DAA senses the transmission frequency $f_m$ of the victim transceiver 140 and attempts to avoid the transmission frequency $f_m$, thereby minimizing interference with the victim transceiver.

Effective implementations of DAA provide efficient avoidance. That is, the wireless device avoids only the portion of the frequency spectrum that might cause interference with another wireless device (victim receiver). If a wireless device transmits a signal having a wide bandwidth, the wireless device may be required to avoid a small portion of frequency spectrum being used by a victim receiver. A digital baseband processor of the wireless device can be controlled to modify the signal modulation to create a new waveform in which the portion of the frequency spectrum to be avoided is notched out. In practice, however, this is not so easy. Generally, distortion caused by analog circuits within analog circuit portions of the wireless device cause spectral leakage to fill in the notch created by the digital baseband processor.

It is desirable have a method and apparatus for reducing spectral leakage of wireless devices, thereby improving performance of DAA systems. The method and apparatus should be capable of reducing spectral leakage due to both frequency-dependent and frequency-independent I-Q imbalance in the wireless devices. Desirably, the method and apparatus do not require specialized or additional electronic circuitry.

SUMMARY OF THE INVENTION

An embodiment of the invention includes a method of reducing spectral leakage due to I-Q imbalance within a transmitter. The method includes the transmitter receiving a data stream of coefficients of a multi-carrier modulation signal. The data stream is pre-processed by processing a set of the coefficients that correspond with selected notch frequencies to reduce the effects of I-Q imbalance of the transmitter, wherein at least a portion of the set of coefficients corresponds to non-symmetrical notch frequencies. The pre-processed data stream is multi-carrier modulated. The multi-carrier modulated pre-processed data stream is I-Q modulated before transmission.

Another embodiment of the invention includes a transmitter that includes means for reducing I-Q imbalance of the transmitter. The transmitter receives a data stream of coefficients of a multi-carrier modulation signal. The data stream is pre-processed by processing a set of the coefficients that correspond with selected notch frequencies to reduce the effects of I-Q imbalance of the transmitter. At least a portion of the set of coefficients corresponds with non-symmetrical notch frequencies. A multi-carrier modulator multi-carrier modulates the pre-processed data stream, and an I-Q modulator I-Q modulates the multi-carrier modulated pre-processed data stream.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 4 is a flow chart of one example of a method of reducing spectral leakage due to I-Q imbalance within a transmitter.

DETAILED DESCRIPTION

The invention includes transmitter preprocessing methods and transmitter systems that reduce spectral leakage. The transmitters provide for reduction of transmitter distortion (causing spectral leakage) that can reduce the effectiveness of frequency notching of the transmitter to avoid particular portion of frequency spectrum.

A primary source of spectral leakage of a wireless transmitter is from transmitter distortion caused by I-Q imbalance of an I-Q modulator used for direct frequency up-conversion within the transmitter. The use of direct frequency up-conversion radios is becoming increasingly popular because direct frequency up-conversion radios avoid the need for expensive intermediate frequency bandpass filters, and avoid the need for double up-conversion transmitter architectures. I-Q imbalance is a major source of distortion in direct conversion transmitters.

The notch depths achievable by baseband signal frequency notching is severely compromised without reducing or eliminating the effects of I-Q imbalance. Unmitigated I-Q imbalance can force the use of more frequency spectrum being wasted during transmission to successfully achieve the requirements of DAA.

Figure 1:
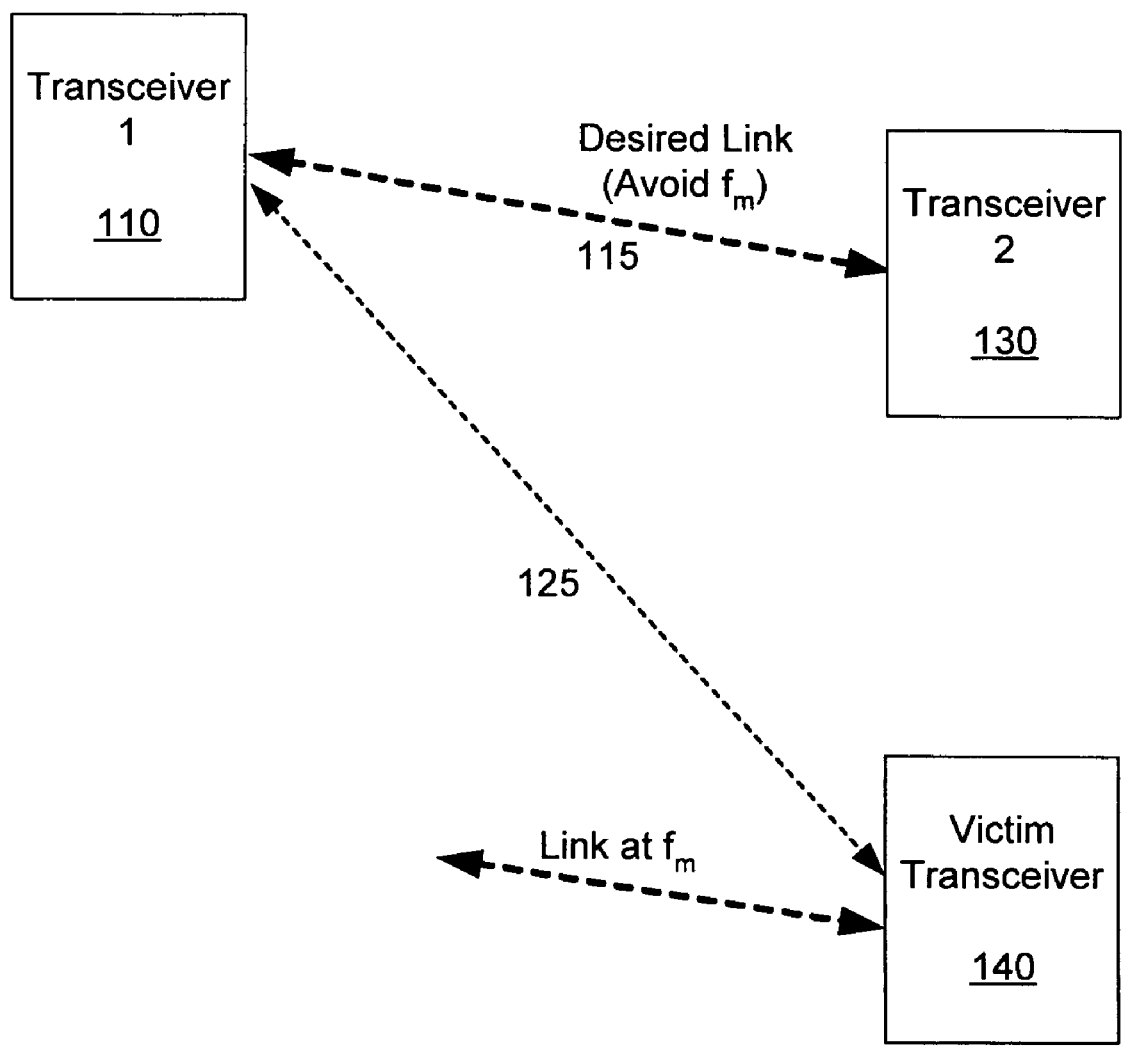
FIG. 1 shows a prior art wireless network.
Figure 2:
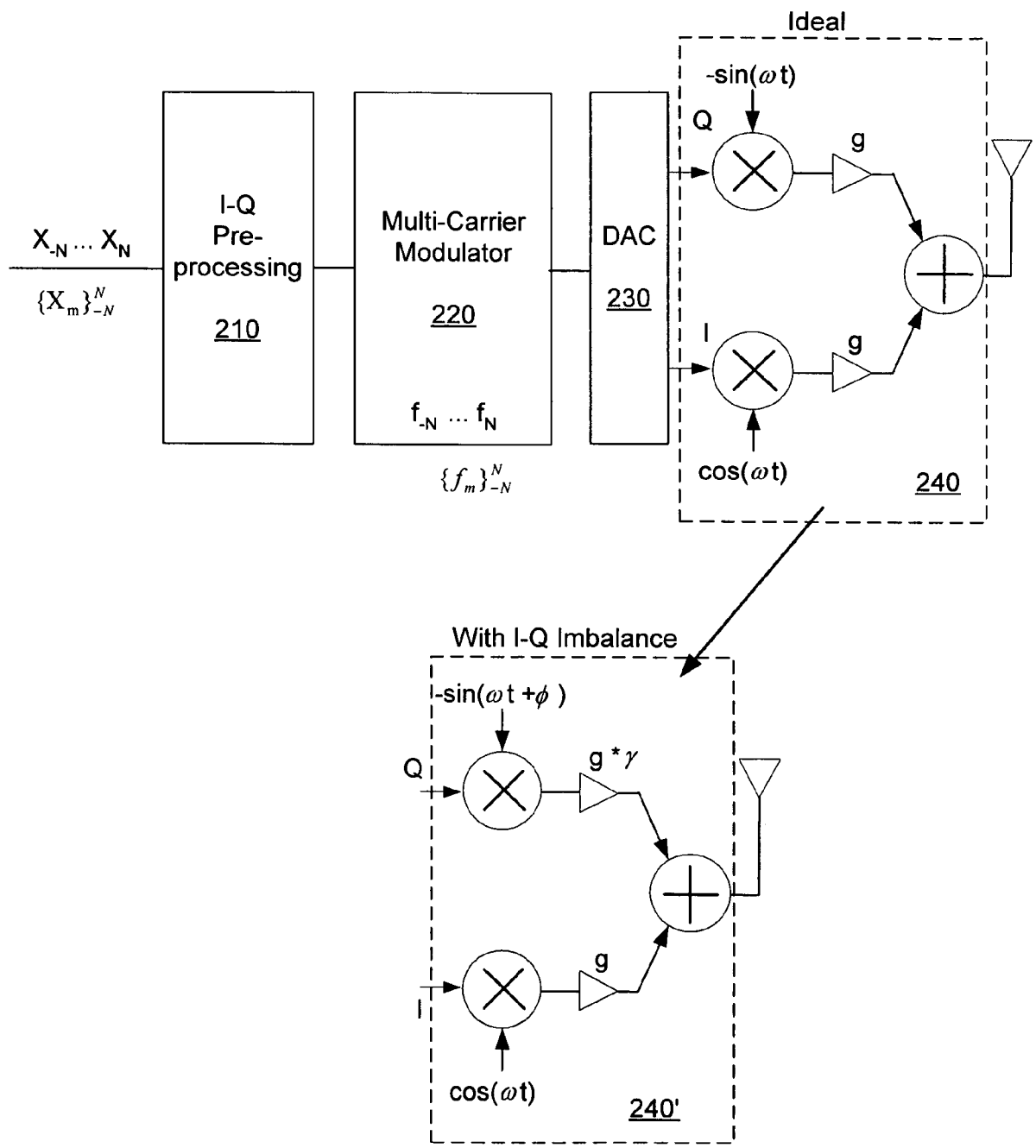
FIG. 2 shows one example of a multi-carrier modulation transmitter the can implement methods of pre-processing to reduce spectral leakage due to I-Q imbalance.

FIG. 2 shows one example of an embodiment of a transmitter that can implement methods of reducing spectral leakage, and therefore, improve the effectiveness of baseband signal processing for avoiding/notching particular portions of frequency spectrum. The transmitter receives a data stream that includes data coefficients $X_{-N} \ldots X_N$. The data stream coefficients are pre-processed by an I-Q pre-processor 210 that pre-distorts the data stream so that multi-carrier signals generated by the data stream coefficients have their I-Q imbalance suppressed at particular frequencies.

A multi-carrier modulator 220 receives the data coefficients and generates a multi-carrier signal from them. One embodiment includes 2N+1 carriers corresponding to the 2N+1 data stream coefficients. A common choice for the multi-carrier modulation is orthogonal frequency division multiplexing (OFDM) modulation.

The multi-carrier modulated signal is converted to an analog signal by a digital-to-analog converter (DAC) 230. The analog signal is I-Q modulated by an I-Q modulator 240. The I-Q modulator 240 used to frequency up-convert the analog signals before transmission includes an in-phase (I) chain and a quadrature-phase (Q) chain. Ideally, the Q chain up-converting signal ($-\sin(\omega t)$) is 90 degrees out of phase with the I chain up-converting signal ($\cos(\omega t)$). The two chains are amplified by gain elements g before being summed and transmitted. Ideally, the gain elements g of the two chains are identical.

FIG. 2 also shows another depiction of an I-Q modulator 240' that includes I-Q gain and phase imbalances. An I-Q phase imbalance is shown by $\phi$, and an I-Q gain imbalance is shown by $\gamma$ ($\gamma=1$ implies no gain imbalance). One embodiment of the transmitter includes the $\phi$ and $\gamma$ parameters being frequency dependent, and another embodiment includes the $\phi$ and $\gamma$ parameters not being frequency dependent. The I-Q phase and I-Q gain imbalance are shown in the I-Q modulator. However, it is to be understood that the I-Q phase and I-Q gain imbalances can also be due to other components within the transmitter. For example, I and Q DACs and imperfect matching between the analog portions of the I and Q paths can also result in I-Q imbalance.

The transmitter of FIG. 2 includes pre-processing or pre-distorting of the data stream coefficients within the I-Q pre-processor which mitigates the I-Q gain and the I-Q phase imbalances of the transmitter. The result is that pre-processing of the data stream coefficients for avoiding specific portions of frequency spectrum is not hindered by I-Q imbalance to the extent it would be in the absence of the pre-processing. Several different methods of pre-processing can be implemented. But all of the methods can reduce the effects of I-Q imbalance on the selected notch frequencies of the specific portions of the frequency spectrum.

Figure 3:
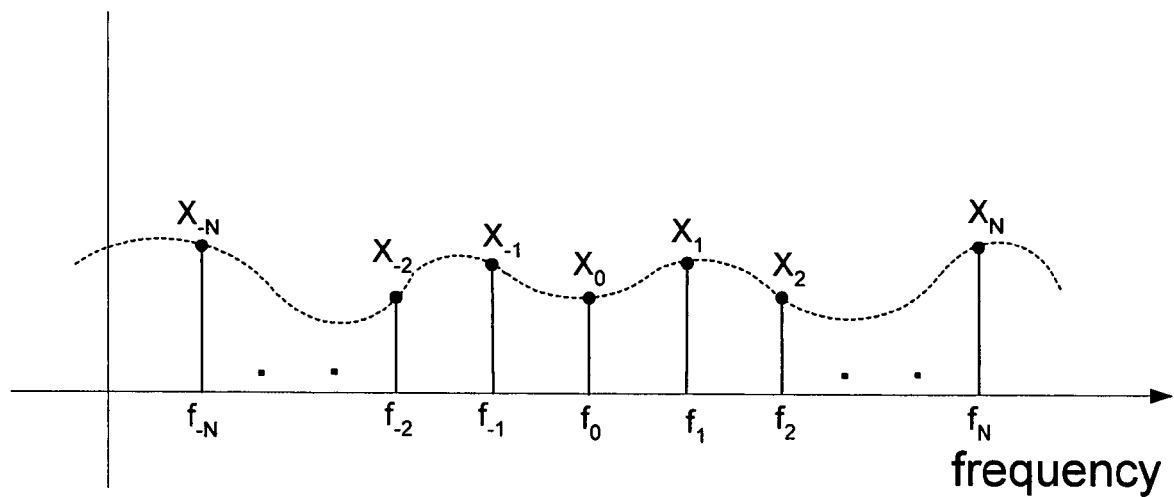
FIG. 3 shows a frequency spectrum corresponding to the coefficients of a multi-carrier modulated signal.

FIG. 3 shows one example of a frequency spectrum of a multi-carrier signal that is generated by the multi-carrier modulator 220. For this example, the multi-carrier signal has carriers at frequencies $f_{-N} \ldots f_0 \ldots f_N$, with corresponding complex coefficients (corresponding to each carrier's amplitude and phase) of $X_{-N} \ldots X_0 \ldots X_N$. Here, the center frequency $f_0$ corresponds to the local oscillator frequency of the I-Q modulator. The multi-carrier signal can be an OFDM signal. For OFDM signals, the output spectrum Y(f), which is the Fourier transform of y(t), has the property that $Y_m = Y(f_m) = X_m$. However, other types of multi-carrier signals can be used as well.

FIG. 4 is a flow chart of one example of a method of reducing spectral leakage due to I-Q imbalance within a transmitter. A first step 410 of the method includes the transmitter receiving a data stream of coefficients of a multi-carrier modulation signal. A second step 420 includes pre-processing the data stream by processing a set of the coefficients that correspond with selected notch frequencies to reduce the effects of I-Q imbalance of the transmitter, wherein at least a portion of the set of coefficients corresponds to non-symmetrical notch frequencies. A third step 430 includes multi-carrier modulating the pre-processed data stream. A fourth step 440 includes I-Q modulating the multi-carrier modulated pre-processed data stream.

The set of coefficients of the data stream includes coefficients that correspond to non-symmetrical notch frequencies. However, the set can additionally include coefficients that correspond to symmetrical notch frequencies as well.

Figure 5:
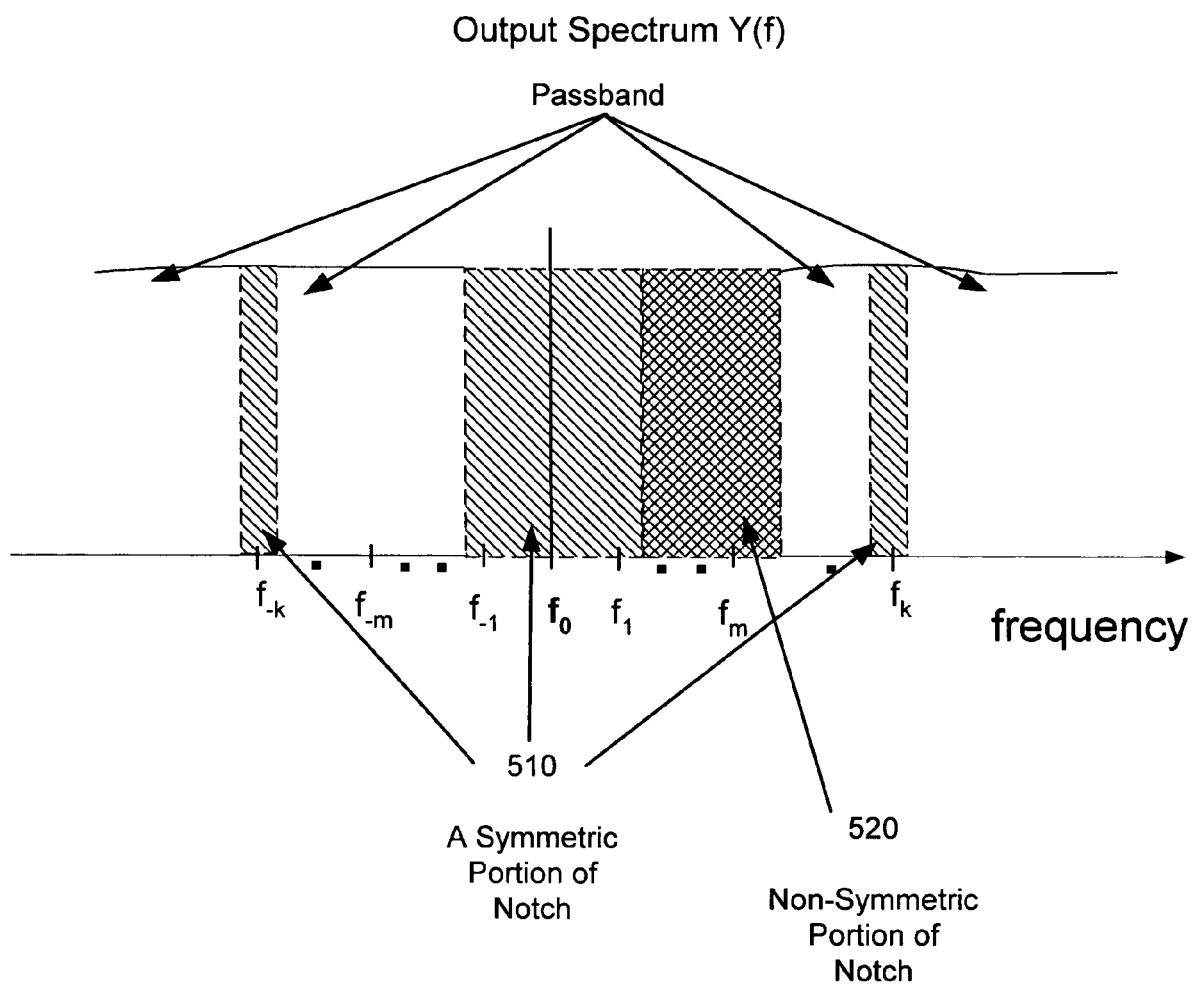
FIG. 5 shows a transmit frequency spectrum depicting frequency notching in which a portion of the notched spectrum is symmetric about a center frequency and therefore not affected by I-Q imbalance, and another portion which is not symmetric about the center frequency is therefore affected by I-Q imbalance.

FIG. 5 shows a transmit frequency spectrum depicting frequency notching in which a portion of the notched spectrum is symmetric about a center frequency, $f_0$, and another portion which is not symmetric about the center. As discussed in the next section, the I-Q imbalance will not affect symmetric notch frequencies because the coefficients will be symmetrically nulled. The notch frequencies include a portion 510 of the frequency spectrum that is symmetrical about center frequency $f_0$, and a portion 520 of the frequency spectrum that is not symmetrical to the center frequency $f_0$. Asymmetrical refers to notch frequencies $f_m$ that do not have a corresponding notch frequency $f_{-m}$. Achieving the desired symmetrical and asymmetrical notches in the output spectrum can be achieved by nulling the corresponding data stream coefficients and further pre-processing only those corresponding to the asymmetric frequencies.

Mathematical Representations of the Effects of I-Q Imbalance

A transmission signal y(t) of the transmitter of FIG. 2 is ideally given as:

$$y(t)=g[X_I(t)\cos(\omega t)-X_Q(t)\sin(\omega t)].$$

However, the phase and gain imbalances can be included and depicted as:

$$y(t)=g[X_I(t)\cos((\omega t)-X_Q(t)\gamma \sin(\omega t+\phi)]$$

where $\gamma-1$ represent IQ gain imbalance ($\gamma=1$ means no gain imbalance) and $\phi$ represents phase imbalance.

For ease of presentation, but without loss of generality, it is initially assumed that notching is only required near a single frequency $f_m$. It is to be understand that the index m can, in fact, be allowed to represent multiple frequencies. Letting $X_m$ be the coefficient (component) of the notch portion of the signal corresponding to frequency $f_m$ and $X_{-m}$ be the coefficient (component) corresponding to the mirror frequency $f_{-m}$. The output of the baseband processing at the notch frequency due to I-Q distortion can be represented by:

$$Y_m = c_1 X_m + c_2^* X_{-m}^*$$

$$Y_m = \left(\frac{1+\gamma\cdot\cos(\phi)}{2} + j\frac{\gamma\sin(\phi)}{2}\right)X_m + \left(\frac{1-\gamma\cdot\cos(\phi)}{2} + j\frac{\gamma\sin(\phi)}{2}\right)^* X_{-m}^*$$

where * means the complex conjugate and $Y_m$ is the output spectrum at $f_m$.

This mathematical representation can be derived by applying the I-Q imbalance to generate y(t) and observing its Fourier transform. That is, first passing x(t) (input data stream) through an I-Q modulator that includes the amplitude and phase imbalances. Next, y(t) is demodulated with an ideal I-Q demodulator. Finally, a discrete fourier transform is taken on the demodulated y(t). It can be observed from this representation that setting $X_m$ to zero or another value that ignores the contribution of $X_{-m}$ to the output spectrum $Y_m$ will not produce a satisfactory notch. For example, zeroing just the $X_m$ coefficient results in leakage due to I-Q imbalances:

$$Y_m = \left(\frac{1-\gamma\cdot\cos(\phi)}{2} - j\frac{\gamma\sin(\phi)}{2}\right)^* X_{-m}^*.$$

One example of data stream pre-processing to reduce the effects of I-Q imbalance includes eliminating leakage by nulling both $X_m$ and $X_{-m}$. The processing of selected coefficients includes pre-processing of –m and m coefficients of the data stream, effecting a notch at a transmit carrier frequency $f_m$. This approach works because leakage due to I-Q imbalance does not affect the output spectrum at frequencies corresponding to symmetrically nulled coefficients $X_m$ and $X_{-m}$. However, by nulling both coefficients, the result is a notch in y(f) at $f_{-m}$ as well as $f_m$. That is, this approach suffers the drawback that the amount of frequency spectrum which is notched is doubled.

Another example of data stream preprocessing includes selecting a value for at least one data stream coefficient $X_m$ to effectively cancel $Y_m$. The leakage at the transmit frequency $f_m$ is reduced by canceling the leakage at the transmit frequency $f_m$ by proper selection of the value of $X_m$. For example, $Y_m$ of the above equation can be zeroed by setting:

$$X_m = -\left(\frac{c_2^*}{c_1}\right)X_{-m}^* = -\left(\frac{1-\gamma^2 - j2\gamma\sin\phi}{1+2\gamma\cos\phi + \gamma^2}\right)X_{-m}^*.$$

By determining or estimating $\gamma$ and $\phi$, $Y_m$ can be canceled by setting $X_m$ to this value. Algorithms used to determine $\gamma$ and $\phi$ are known in the art. The benefit of this approach is that $X_{-m}$ can be used to transmit useful information while $X_m$ is being used to cancel leakage from $X_{-m}$ due to I-Q imbalance, thereby providing a notch in Y(f) at $f_m$.

One embodiment of the above-example includes selecting a value for at least one data stream coefficient $X_m$ reducing leakage at transmit frequency $f_m$ due to data stream coefficient $X_{-m}$. As stated, the leakage $Y_m$ is caused by I-Q imbalance of the transmitter.

One embodiment includes $\gamma$ and $\phi$ being independent of frequency, and another embodiment includes $\gamma$ and $\phi$ being frequency dependent.

Setting $X_m$ as described can be undesirable because complete notching of $Y_m$ requires $X_m$ to satisfy the equation. However, just as I-Q imbalance causes leakage of $X_{-m}$ into $Y_m$, I-Q imbalance also causes leakage $X_m$ into $Y_{-m}$. Therefore, proper selection of $X_m$ according to the method just described, rather than just zeroing it, out has of the side effect of introducing additional noise elements into $Y_{-m}$, effectively lowering the SNR on the portion of the frequency spectrum that is not being notched.

Another example of data stream preprocessing includes choosing $X_m$ to effect notching of $Y_m$ just enough to meet any DAA requirements. This can provide the benefit of limiting the SNR degradation of $Y_{-m}$. The pre-processing of the data stream includes selecting a value for at least one data stream coefficient $X_m$ reducing leakage at transmit frequency $f_m$ due to data stream coefficient $X_{-m}$ the leakage. This can be accomplished by setting:

$$X_m = -\beta\left(\frac{1-\gamma^2 - j2\gamma\sin\phi}{1+2\gamma\cos\phi + \gamma^2}\right)X_{-m}^*$$

where $0<\beta<1$ is chosen as the minimum value such that the notching for $Y_m$ meets the avoidance requirement.

Figure 6:
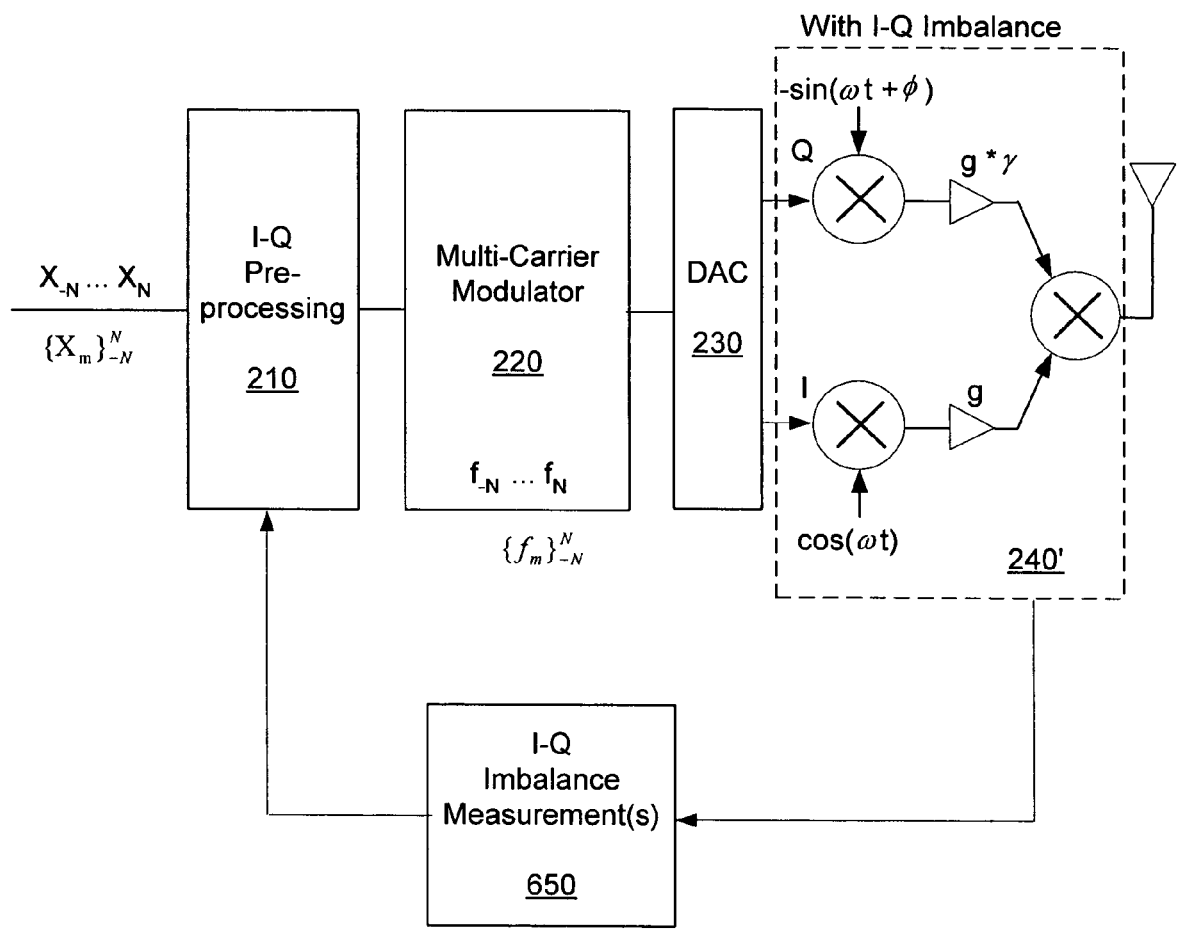
FIG. 6 shows another example of an embodiment of a transmitter that includes measurement of I-Q imbalance to be used by methods of reducing spectral leakage.

FIG. 6 shows another example of an embodiment of a transmitter that includes measurement of I-Q imbalance to be used by methods of reducing spectral leakage. The I-Q imbalance is determined by an I-Q imbalance measurement block 650. The measurements are feedback to the I-Q pre-processing 610. The measurements can be of $\gamma$ and $\phi$, or of leakage constants $c_1$ and $c_2$ as given above, and will be described next.

The pre-processing of the data stream is based at least in part on the measured I-Q imbalance. The selected value of a data stream coefficient $X_m$ can be based at least in part on measured I-Q imbalance. One embodiment includes measuring the I-Q imbalance at a single frequency. Another embodiment includes measuring the I-Q imbalance at each notch frequency $f_m$ or it's corresponding mirror frequency $f_{-m}$.

Based on the above equations, it can be determined that the spectral leakage is linearly proportional to the data coefficients $X_m$ and $X_{-m}$. This suggests that rather than estimating $\gamma$ and $\phi$, the leakage can be estimated directly during a calibration mode, and then canceled out during normal operation using the leakage estimates. As noted above, the output of the baseband processing at the notch frequency due to I-Q distortion can be represented by:

$$Y_m = c_1 X_m + (c_2 X_{-m})^*$$

This embodiment can include a calibration mode in which $c_1$ and $c_2$ are determined. A first step of the calibration can include setting $X_{-m}=0$, measuring $Y_m^{c1}=c_1 X_m$, and setting the estimate $\tilde{c}_1 = Y_m^{c1}/X_m$. A second step can include setting $X_m=0$, measuring $Y_m^{c2}=(c_2 X_{-m})^*$, and setting the estimate $\tilde{c}_2 = (Y_m^{c2})^*/X_{-m}$. During normal operation, a third step can be executed that includes setting $$X_m = -\frac{(\tilde{c}_2 X_{-m})^*}{\tilde{c}_1}.$$

Generally, this embodiment includes determining $X_m$ by measuring spectral leakage at $f_m$ due to $X_{-m}$ when $X_m$ is zeroed, and by measuring spectral leakage at $f_m$ due to $X_m$ when $X_{-m}$ is zeroed.

In general, the choice of $X_m=0$ does not provide the best notch around frequency $f_m$ (even without IQ imbalance). This is due to energy leakage from adjacent tones arising from the digital to analog conversion in the transmitter. To provide a better notch, the values of $X_m$ maybe chosen to minimize some function (generally the choice will be to minimize some measure of the energy surrounding the notch frequencies). Methods for doing so have been discussed in the art. However, in the presence of IQ imbalance, such methods for choosing of $X_m$ have to be modified.

To start, the previous equation representing the spectral leakage due to I-Q imbalance is re-written with the introduction of an operator $IQ_m(,\ )$. $IQ_m$ represents the effect of I-Q imbalance on the indices m but can, in general, be any bi-linear operator which is subjective in the first argument:

$$Y_m = IQ_m(X_m, X_{-m}) \equiv c_1 X_m + (c_2 X_{-m})^*.$$

The subscript m is replaced with $\vec{m} = \{m_1, m_2, \ldots, m_n\}$ for generalization so that multiple tones can be explicitly treated simultaneously. In this notation, let $-\vec{m} = \{-m_1, -m_2, \ldots, -m_n\}$ be the mirror image of $\vec{m}$ with m=0 corresponding to frequency $f_0$, the middle of the spectrum. Now, the output equation can be replaced with:

$$Y_{\vec{m}} = IQ_{\vec{m}}(X_{\vec{m}}, X_{-\vec{m}}) = c_1 X_{\vec{m}} + (c_2 X_{-\vec{m}})^*.$$

Now, define the operator P which maps the X coefficients to some energy function in the notch frequencies at a subset of the frequencies indexed by $\vec{m}$. Also, define $^-P$ as the operator mapping the X coefficients to the energy function in the subset of mirror frequencies indexed by $-\vec{m}$. Finally, define:

$P_{\vec{m}}$ as the restriction of P to the range of $\vec{m}$ $^-P_{\vec{m}}$ as the restriction of $^-P$ to the range of $-\vec{m}$ g as the vector of coefficients X with values at indices $\vec{m}$ replaced by 0.

Then the energy in the notch frequencies can be expressed using the last equation, $$IQ_{\vec{m}}(P_{\vec{m}} X_{\vec{m}} + Pg, {}^-P_{\vec{m}} X_{\vec{m}} + {}^-Pg) = c_1(P_{\vec{m}} X_{\vec{m}} + Pg) + (c_2({}^-P_{\vec{m}} X_{\vec{m}} + {}^-Pg))^*.$$

By minimizing this expression, the energy in the notch frequencies is minimized. This can be done by choosing $X_{\vec{m}}$ to satisfy $$c_1 P_{\vec{m}} X_{\vec{m}} + (c_2 {}^-P_{\vec{m}} X_{\vec{m}})^* = -(c_1 Pg + (c_2 {}^-Pg)^*).$$

This equation can be solved by making the real part of the left-hand side equal the real part of the right-hand side, and similarly for the imaginary parts. For a complex variable, z, we have $z + z^* = 2\,\mathrm{Re}\{z\}$ and $z - z^* = j2\,\mathrm{Im}\{z\}$. Therefore, defining $a \equiv -2\,\mathrm{Re}\{c_1 Pg + (c_2 {}^-Pg)^*\}$ and $b \equiv -j2\,\mathrm{Im}\{c_1 Pg + (c_2 {}^-Pg)^*\}$, the last equation can be split into separate equations for the real and imaginary parts as $$c_1 P_{\vec{m}} X_{\vec{m}} + (c_2 {}^-P_{\vec{m}} X_{\vec{m}})^* + (c_1 P_{\vec{m}} X_{\vec{m}})^* + c_2 {}^-P_{\vec{m}} X_{\vec{m}} = a$$

$$c_1 P_{\vec{m}} X_{\vec{m}} + (c_2 {}^-P_{\vec{m}} X_{\vec{m}})^* - (c_1 P_{\vec{m}} X_{\vec{m}})^* - c_2 {}^-P_{\vec{m}} X_{\vec{m}} = b.$$

Let $C_1 \equiv c_1 P_{\vec{m}} + c_2 {}^-P_{\vec{m}}$ and $C_2 \equiv c_1 P_{\vec{m}} - c_2 {}^-P_{\vec{m}}$. Then the last two equations become $$C_1 X_{\vec{m}} + (C_1 X_{\vec{m}})^* = a$$

$$C_2 X_{\vec{m}} - (C_2 X_{\vec{m}})^* = b.$$

Defining the matrix $$C = \begin{bmatrix} C_1 & C_1^* \\ C_2 & -C_2^* \end{bmatrix}$$

the last two equations can be written more compactly as $$C \begin{bmatrix} X_{\vec{m}} \\ X_{\vec{m}}^* \end{bmatrix} = \begin{bmatrix} a \\ b \end{bmatrix}$$

One solution to this equation is given by the Moore-Penrose pseudo-inverse:

$$\begin{bmatrix} X_{\vec{m}} \\ X_{\vec{m}}^* \end{bmatrix} = (C^T C)^{-1} C^T \begin{bmatrix} a \\ b \end{bmatrix},$$

where $^T$ indicates Hermitian transpose. Other solutions corresponding to other energy metrics are possible.

Although specific embodiments of the invention have been described and illustrated, the invention is not to be limited to the specific forms or arrangements of parts so described and illustrated. The invention is limited only by the appended claims.

What is claimed:

1. A method of reducing spectral leakage due to I-Q imbalance within a transmitter, comprising:
   the transmitter receiving a data stream of coefficients of a multi-carrier modulation signal;
   measuring I-Q imbalance of the transmitter;
   pre-processing the data stream by processing a set of the coefficients that correspond with selected notch frequencies to reduce the effects of I-Q imbalance of the transmitter, wherein at least a portion of the set of coefficients corresponds to non-symmetrical notch freqencies, wherein the pre-processing of the data stream is based at least in part on the measured I-Q imbalance;
   multi-carrier modulating the pre-processed data stream;
   I-Q modulating the multi-carrier modulated pre-processed data stream.

2. A method of reducing spectral leakage due to I-Q imbalance within a transmitter, comprising:
   the transmitter receiving a data stream of coefficients of a multi-carrier modulation signal;
   pre-processing the data stream by processing a set of the coefficients that correspond with selected notch frequencies to reduce the effects of I-Q imbalance of the transmitter, wherein at least a portion of the set of coefficients corresponds to non-symmetrical notch frequencies, wherein the set of coefficients additionally corresponds to symmetrical notch frequencies;
   multi-carrier modulating the pre-processed data stream;
   I-Q modulating the multi-carrier modulated pre-processed data stream.

3. The method of claim 1, wherein measuring I-Q imbalance of the transmitter comprises measuring the I-Q imbalance at a single frequency.

4. The method of claim 2, further comprising pre-processing data stream coefficients corresponding to symmetric notch frequencies to affect a notch at a transmit carrier frequency $f_m$.

5. A method of reducing spectral leakage due to I-Q imbalance within a transmitter, comprising:
- the transmitter receiving a data stream of coefficients of a multi-carrier modulation signal;
- pre-processing the data stream by processing a set of the coefficients that correspond with selected notch frequencies to reduce the effects of I-Q imbalance of the transmitter, wherein at least a portion of the set of coefficients corresponds to non-symmetrical notch frequencies;
- multi-carrier modulating the pre-processed data stream;
- I-Q modulating the multi-carrier modulated pre-processed data stream;
- wherein pre-processing of the data stream comprises:
- selecting a value for at least one data stream coefficient $X_m$ reducing leakage at transmit frequency $f_m$ due to data stream coefficient $X_{-m}$, the leakage being caused by I-Q imbalance of the transmitter;
- wherein selecting the value of the data stream coefficient $X_m$ is based at least in part on measured I-Q imbalance.

6. The method of claim 5, wherein the measured I-Q imbalance is frequency dependent.

7. The method of claim 5, wherein the measured I-Q imbalance is frequency independent.

8. The method of claim 5, wherein the value for $X_m$ is determined by measuring spectral leakage at $f_m$ due to $X_{-m}$ when $X_m$ is zeroed, and by measuring spectral leakage at $f_m$ due to $X_m$ when $X_{-m}$ is zeroed.

9. The method of claim 5, wherein reducing the leakage at the transmit frequency $f_m$ comprises canceling the leakage at the transmit frequency $f_m$ by proper selection of the value of $X_m$.

10. A transmitter that includes means for reducing I-Q imbalance of the transmitter, comprising:
- the transmitter receiving a data stream of coefficients of a multi-carrier modulation signal;
- means for pre-processing the data stream by processing a set of the coefficients that correspond with selected notch frequencies to reduce the effects of I-Q imbalance of the transmitter, wherein at least a portion of the set of coefficients corresponds to non-symmetrical notch frequencies;
- a multi-carrier modulator for multi-carrier modulating the pre-processed data stream;
- an I-Q modulator for I-Q modulating the multi-carrier modulated pre-processed data stream;
- means for measuring I-Q imbalance of the transmitter; and wherein
- the pre-processing of the data stream is based at least in part on the measured I-Q imbalance.

11. The transmitter of claim 10, wherein the set of coefficients additionally corresponds to symmetrical notch frequencies.

12. The transmitter of claim 10, wherein measuring I-Q imbalance of the transmitter comprises measuring the I-Q imbalance at a single frequency.

13. The transmitter of claim 11, further comprising pre-processing data stream coefficients corresponding to symmetric notch frequencies to affect a notch at a transmit carrier frequency $f_m$.

14. The transmitter of claim 10, wherein pre-processing of the data stream comprises:
- selecting a value for at least one data stream coefficient $X_m$ reducing leakage at transmit frequency $f_m$ due to data stream coefficient $X_{-m}$ the leakage being caused by I-Q imbalance of the transmitter.

15. The transmitter of claim 14, wherein selecting the value of the data stream coefficient $X_m$ is based at least in part on measured I-Q imbalance.

16. The transmitter of claim 14, wherein the value for $X_m$ is determined by measuring spectral leakage at $f_m$ due to $X_{-m}$ when $X_m$ is zeroed, and by measuring spectral leakage at $f_m$ due to $X_m$ when $X_{-m}$ is zeroed.

17. The transmitter of claim 14, wherein reducing the leakage at the transmit frequency $f_m$ comprises canceling the leakage at the transmit frequency $f_m$ by proper selection of the value of $X_m$.

* * * * *